Sept. 9, 1969 R. M. CHAPPEL ET AL 3,465,421

HIGH TEMPERATURE BONDING TO GERMANIUM

Filed Dec. 20, 1966

INVENTORS
Raymond M. Chappel
Kamala S. Krishnan
Charles W. Van Hise
BY Sheldon H Parker
ATTORNEY 3,465,421

HIGH TEMPERATURE BONDING TO GERMANIUM

Raymond M. Chappel, Whippany, Kamala S. Krishnan, Somerville, and Charles W. Van Hise, Union, N.J., assignors to American Standard Inc., New York, N.Y., a corporation of Delaware Filed Dec. 20, 1966, Ser. No. 603,230
Int. Cl. B23k *31/02*
U.S. Cl. 29—494 14 Claims

ABSTRACT OF THE DISCLOSURE

The disclosure relates to bonding of a lead of a refractory metal to a semiconductive element of germanium. The method involves cleaning the surfaces to be bonded, pressing said surfaces together under a pressure of at least about 5,000 pounds per square inch and heating the compressed surfaces to a temperature in the range from 750 to 850 degrees C. in a substantially inert atmosphere for at least 5 minutes.

This invention is concerned with a novel method for bonding electrical leads to semiconductor devices composed of germanium. More specifically the present invention relates to thermocompression bonding of certain refractory metals to germanium.

Heretofore, two principal prior art methods for providing electrical contact with germanium have been practiced. One of these involves the soldering of electrical leads to germanium, but results in connections having high ohmic resistance.

The second prior art method involves the thermo-compression bonding of high ductility metal leads to germanium.

Both of the above prior art techniques result in assemblies which cannot be used at temperatures much above 400° C. This limitation is due to the diffusion of the solders used or of the lead wire material into the germanium body or to the formation of low melting germanium containing eutectic compositions. It would be advantageous therefore to have metal to germanium connections which are usable above 400° C., and preferably at at least 600° C.

The claimed method provides assemblies which can operate up to as high as 900° C., by departing from previous thinking in this field and using a high melting metal, selected from the group consisting of tungsten, molybdenum, tantalum, niobium, vanadium, chromium, iridium, rhodium, zirconium, hafnium, osmium, rhenium and titanium as the metallic lead to a germanium semiconductor.

It is thus the main object of this invention to provide a metal to germanium bond which is strong and durable, up to and above about 600° C. and remains electronically effective up to and aove 400° C.

It is a further object of this invention to provide an improved method of thermocompressively bonding refractory metals to germanium, which method results in ohmic bonds having low contact resistances.

Yet another object of this invention is to provide a method for bonding a fine refractory metal wire or ribbon to the surface of a germanium body.

Still another object of the claimed invention is to provide a refractory metal to germanium bond which has a contact resistance 100 to 1000 times lower than a soldered connection between these metals.

Figure 1:
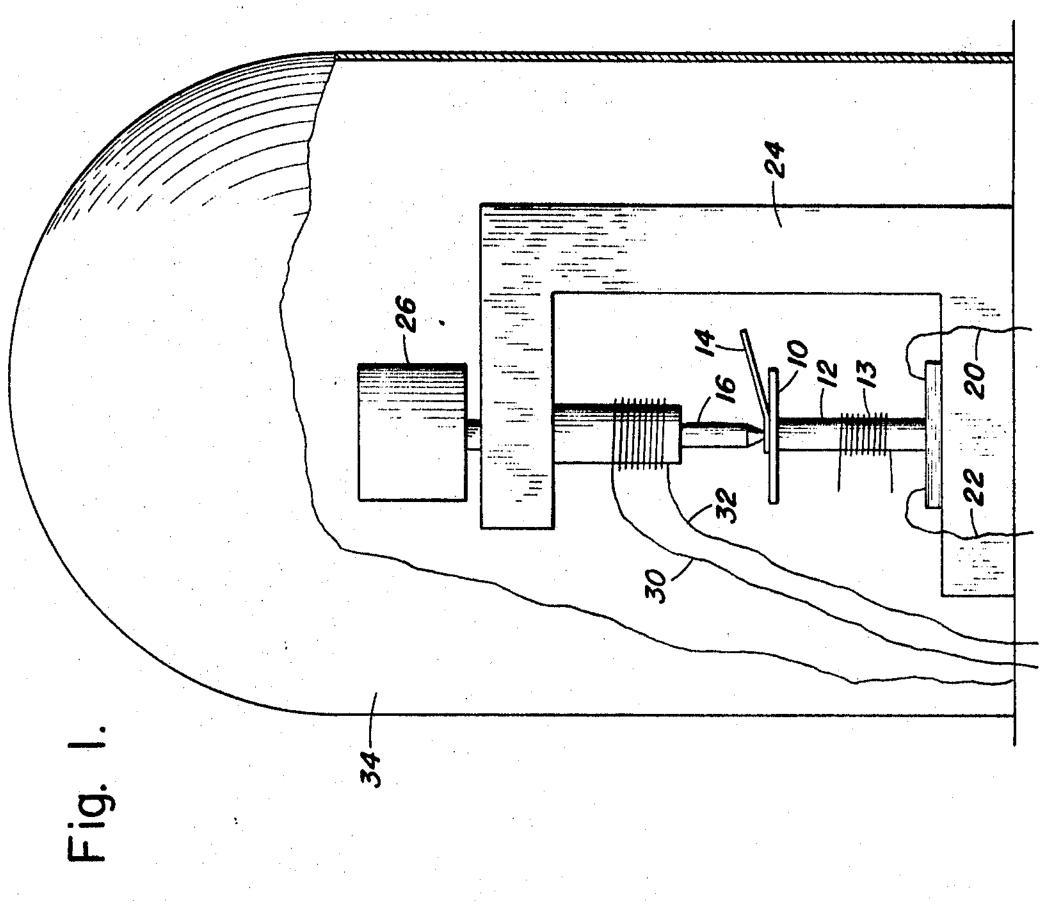
Figure 2:
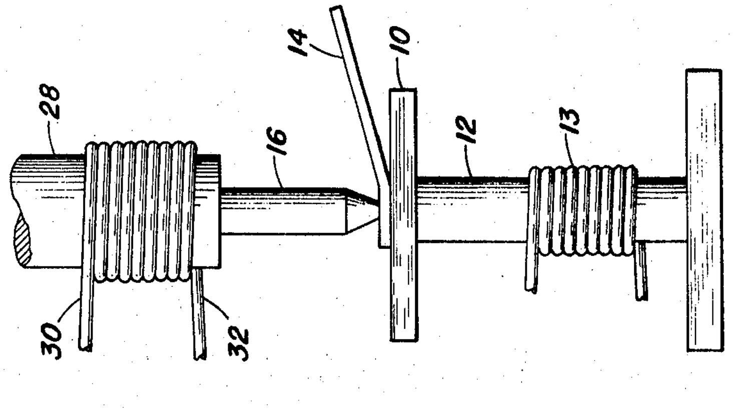

These and other related objects, features and advantages of the claimed invention will be more readily understood as the description thereof proceeds; particularly when taken together with the accompanying drawing wherein:

FIG. 1 is a cross-sectional view of the complete apparatus needed for the practice of the method of the invention; and FIG. 2 is a sectional view in detail of the apparatus and assembly of the invention.

For the purposes of the present invention, it will be understood that the term "thermocompression bonding" is as defined in the article "Electrical Contact With Thermo-Compression Bonds," pages 127–130 of the April 1958 issue of the Bell Laboratories Record and refers to a metallic bond made without any intermediate layer between the components thereof, such as solder, and without significant alloying taking place between the united surfaces.

Briefly stated, the method of the claimed invention comprises pressing a degreased refractory metal wire or ribbon against a degreased and chemically etched germanium member supported on a heated platen of ceramic, tungsten carbide, sapphire, or other hard refractory material at a pressure of about 5000 to 10,000 p.s.i. The assembly just described is then placed in a vacuum chamber which is evacuated to $10^{-4}$ to $10^{-5}$ mm. The assembly is then heated to a temperature of 750 to 850 degrees C. The temperature and pressure are maintained on the assembly for at least 15 minutes. Instead of thermocompression bonding in a vacuum, the method of the invention may be practiced in an inert atmosphere such as that provided by a rare gas (argon, krypton, xenon, neon or helium). Because of the physical and chemical properties of germanium and the refractory metals, the enumerated conditions are necessary to obtain a refractory metal to germanium bond which is strong and durable at temperatures up to and above 600° C. The stated bonding pressure is especially important since it causes penetration of the refractory metal through the germanium oxide layer which invariably forms on germanium when it is exposed to air, and results in a very low contact resistance. Operating outside the parameters of the claimed method, as above set forth, has been found to produce unsatisfactory bonds.

As above stated, prior to subjecting it to the method of the invention, the refractory metal wire is degreased. This is done conventionally by for example, immersing it in trichloro-ethylene, hexane, or other organic degreasing agents. The same treatment is given to the germanium surface, which, in addition, is also etched chemically or electrochemically. A typical chemical etchant which can be used is the so-called CP–4, which contains 15 parts HF, 25 parts $HNO_3$, 15 parts HAc and .3 bromine.

The method of the invention can best be illustrated by reference to the accompanying drawing. As shown in FIGS. 1 and 2, a slice of germanium 10 is placed on a support 12 composed of tantalum carbide, sapphire or other heat conductive material which will not melt or buckle under the operating conditions of the claimed method. Platen 12 rests on a suitable heater 13 on support member 24 which is heated by passing a current through a thin section thereof. Current is provided to leads 20 and 22 of the heater. Next a refractory metal wire or ribbon 14 is superimposed on the germanium and pressed thereagainst by a wedge 16 made of a material similar to that of support 12. Wedge 16 fits into the lower section 28 of metallic weight member 26, which passes through an opening in the upper part of support 24. Electrical leads 30 and 32 carry current to said lower section 28 so the same acts as a resistance heater. The entire assembly then is inserted in an evacuable vessel 34. The pressure on the refractory metal-germanium surface is set at a pressure within the range of 5000 to 10,000 p.s.i. by placing weights on a platform provided atop weight member 26.

Vessel 34 is provided with means (not shown) for evacuating the same and for filling it with an inert gas, so that the vessel may contain a substantially oxygen-free atmosphere.

The vessel is then evacuated $10^{-4}$ to $10^{-5}$ mm. The germanium-refractory metal bond then is heated slowly to 750 to 850 degrees C. by controlling the current supplied to the heating elements with a variable resistor or other variable current device. The temperature and pressure are maintained for at least 15 minutes and the bond is then allowed to cool to room temperature.

Refractory metal to germanium bonds made as above described are strong and highly conductive. Generally, the contact resistance of these bonds is 100 to 1000 times lower than that of metal to germanium bonds made by conventional soldering. For example, bonds made by the claimed method with 1 mm. wide tantalum ribbon were found to have a resistance of only 0.1 ohm. This contact resistance was obtained by using either vacuum conditions or an inert gas during thermocompression bonding.

It has been found that maintaining the pressure and temperature for over 15 minutes does not further increase bond strength, however, the period should not be less than 5 minutes and preferably should be at least about 10 minutes.

The use of molybdenum and tungsten as the refractory metal, yielded bonds which survived being subjected to temperatures in excess of 900° C. tantalum to germanium bonds survived temperatures in excess of 600° C. Niobium, vanadium and chromium had the same crystal structure as tantalum and only slightly higher coefficients of expansion and will yield bonds about as good as tantalum to germanium bonds. Iridium and rhodium have coefficients of expansion quite close to that of germanium and have crystal structures adequately similar to that of germanium to produce bonds which will at least survive temperatures in excess of 400° C. Where the refractory metal was zirconium a bond was produced which survived temperatures in excess of 800° C. Hafnium, osmium, rhenium and titanium have the same crystal structures as zirconium. The coefficients of expansion for hafnium, osmium and rhenium are very close to that of germanium and zirconium and will yield about the same results as zirconium. Titanium has a slightly higher coefficient of expansion than zirconium and germanium, but a titanium to germanium bond can be produced which will survive a temperature in excess of 400° C.

The method and means disclosed can be used for a variety of metallic shapes of the type disclosed.

As various modifications can be made in the details of the present invention without departing from the spirit and scope thereof, it is to be understood that all matter herein is to be interpreted as illustrative and not in a limiting sense.

What is claimed is:

1. The method of bonding a lead of a refractory metal to a semiconductive element of germanium, which method comprises cleaning the surfaces to be bonded, pressing said surfaces together under a pressure of at least about 5000 pounds per square inch and heating the compressed surfaces to a temperature in the range from 750 to 850 degrees C. in a substantially inert atmosphere for at least 5 minutes.

2. The method of bonding a lead of a refractory metal to a semiconductive element of germanium, which method comprises chemically cleaning the surfaces of said lead and of said element, etching the surface of said element, pressing said surfaces together by applying thereto a pressure of at least about 5000 pounds per square inch, and heating the compressed surfaces in a vacuum to a temperature in the range of from 750 to 850 degrees C. for at least 5 minutes.

3. The method of claim 2, wherein said vacuum is higher than $10^{-4}$.

4. The method of claim 2, wherein the compressed surfaces are heated in an inert atmosphere.

5. The method of claim 1, wherein the pressure and temperature are maintained for at least about 10 minutes.

6. The method of claim 2, wherein the pressure and temperature are maintained for at least about 10 minutes.

7. The method of claim 1, wherein the lead is a refractory metal selected from the group consisting of tungsten, molybdenum, tantalum, niobium, vanadium, chromium, irridium, rhodium, zirconium, hafnium, osmium rhenium and titanium.

8. The method of claim 2, wherein the lead is a refractory metal selected from the group consisting of tungsten, molybdenum, tantalum, niobium, vanadium, chromium, iridium, rhodium, zirconium, hafnium, osmium, rhenium and titanium.

9. The method of claim 1, wherein the refractory metal is tungsten.

10. The method of claim 1, wherein the refractory metal is zirconium.

11. The method of claim 1, wherein the refractory metal is molybdenum.

12. The method of claim 2, wherein the refractory metal is tungsten.

13. The method of claim 2, wherein the refractory metal is zirconium.

14. The method of claim 2, wherein the refractory metal is molybdenum.

References Cited

UNITED STATES PATENTS

| | | | |
|---|---|---|---|
| 2,646,536 | 7/1953 | Benzer. | |
| 2,744,314 | 5/1956 | Kinney | 29—471 |
| 2,753,623 | 7/1956 | Boessenkool | 29—497 |
| 3,006,067 | 10/1961 | Anderson | 29—497.5 X |
| 3,075,282 | 1/1963 | McConville | 29—497.5 X |
| 3,217,401 | 11/1965 | White | 29—472.9 X |
| 3,235,957 | 2/1966 | Horsting | 29—504 X |
| 3,256,598 | 6/1966 | Kramer. | |

JOHN F. CAMPBELL, Primary Examiner

R. B. LAZARUS, Assistant Examiner

U.S. Cl. X.R.

29—497.5, 498, 504